United States Patent
Wang

(10) Patent No.: US 9,845,401 B2
(45) Date of Patent: Dec. 19, 2017

(54) SURFACE CONTROL ADDITIVE FOR RADIATION CURING SYSTEM, PREPARATION METHOD THEREFOR AND APPLICATION THEREOF

(71) Applicants: Zhijun Wang, Shanghai (CN); AFCONA CHEMICALS (HAIMEN), Jiangsu (CN)

(72) Inventor: Zhijun Wang, Shanghai (CN)

(73) Assignees: Zhijun Wang, Shanghai (CN); AFCONA CHEMICALS (HAIMEN) CO., LTD., Haimen, Jiangsu (CN)

( * ) Notice: Subject to any disclaimer, the term of this patent is extended or adjusted under 35 U.S.C. 154(b) by 0 days.

(21) Appl. No.: 14/423,130

(22) PCT Filed: Oct. 8, 2012

(86) PCT No.: PCT/CN2012/001357
§ 371 (c)(1),
(2) Date: Feb. 22, 2015

(87) PCT Pub. No.: WO2014/029046
PCT Pub. Date: Feb. 27, 2014

(65) Prior Publication Data
US 2015/0240092 A1     Aug. 27, 2015

(30) Foreign Application Priority Data
Aug. 22, 2012 (CN) .......................... 2012 1 0299918

(51) Int. Cl.
| | | |
|---|---|---|
| *C09D 11/107* | (2014.01) | |
| *C08G 77/46* | (2006.01) | |
| *C09D 11/101* | (2014.01) | |
| *G03F 7/004* | (2006.01) | |
| *G03F 7/075* | (2006.01) | |
| *C08G 77/20* | (2006.01) | |

(52) U.S. Cl.
CPC ............ *C09D 11/107* (2013.01); *C08G 77/20* (2013.01); *C08G 77/46* (2013.01); *C09D 11/101* (2013.01); *G03F 7/0048* (2013.01); *G03F 7/0752* (2013.01)

(58) Field of Classification Search
CPC ...... C08G 77/46; C09D 11/00; C09D 11/101; C09D 11/107; G03F 7/0048; G03F 7/0752
USPC ....................................................... 526/279
See application file for complete search history.

(56) References Cited

U.S. PATENT DOCUMENTS 5,977,282 A * 11/1999 Ebbrecht ................ C08G 77/38
524/866

FOREIGN PATENT DOCUMENTS

CN      101468301 A  *  7/2009  .............. B01F 17/54
JP      2009191207 A  *  8/2009  .............. C08G 77/38

* cited by examiner

*Primary Examiner* — Ling Choi
*Assistant Examiner* — Chun-Cheng Wang
(74) *Attorney, Agent, or Firm* — Kening Li; Miller Cranfield

(57) ABSTRACT

The present invention is related to a surface control additive for a radiation curing system, the method for its preparation as well as its application. The surface control additive has the following structure:

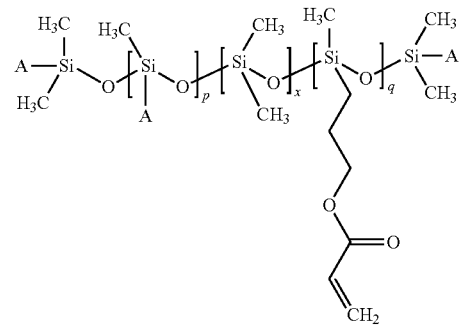

wherein A is

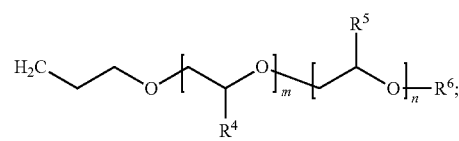

wherein m is an integer from 0 to 400, n is an integer from 1 to 500, x is an integer from 0 to 800, p is an integer from 0 to 600, q is an integer from 1 to 800, $R^4$ and $R^5$ are H or $CH_3$ respectively, $R^6$ is H or a linear or a branched alkyl group containing 1-18 carbon atoms or an acyl group containing 2-5 carbon atoms. The surface control additive of the present invention is applied to radiation curing (UV/EB) paint and inks, enables the coatings to maintain non-adhesive and smooth for a long time, and minimizes transferable precipitates from a cured film. In addition, by using different combinations of EO and PO, the surface control additive of the present invention can adapt to a free selection from high-polarity aquosity to a low-polarity aliphatic hydrocarbon solvent system.

11 Claims, 1 Drawing Sheet

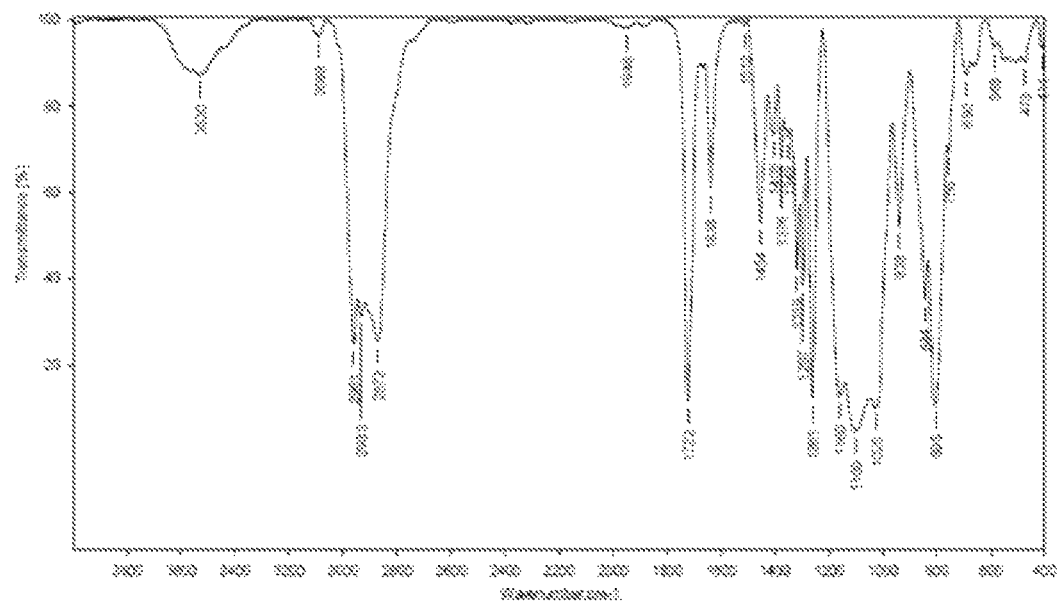

SURFACE CONTROL ADDITIVE FOR RADIATION CURING SYSTEM, PREPARATION METHOD THEREFOR AND APPLICATION THEREOF

FIELD OF THE INVENTION

The present invention is related to a surface control additive for radiation curing system, its preparation method and its application. The surface control additive is polyether modified polysiloxane and has a good surface control effect for radiation curing paint and inks, has a wide compatibility and can maintain the smoothness of the coating for a long time.

BACKGROUND

UV/EB radiation curing paint and ink are fast in curing, environment friendly, energy saving, and can be used on all kinds of base material, and therefore have wider and wider application in quite a few areas. With the development of UV/EB radiation curing paint and ink, there is higher and higher standard for the additives applied within. The traditional organic modified polysiloxane can no longer satisfy the needs of radiation curing systems and is gradually replaced by UV/EB curable acryloyl oxygen alkyl modified polysiloxane. Since UV/EB curable acryloyl oxygen alkyl modified polysiloxane has taken part in the film formation reaction, the smoothness of the coating layer can be maintained for a long time and the precipitation can be controlled to the lowest level.

Acryloyl oxygen alkyl modified polysiloxane can be obtained by different polycondensation or addition reaction. For example, the US patent document, U.S. Pat. No. 4,035,355, disclosed a method to prepare acryloyl oxygen alkyl modified polysiloxane, in which methyl chlorosilane and acryloyl group containing chlorosilane undergo hydrolytic condensation reaction. However, the hydrochloric acid released in the process has to be neutralized, which complicates the whole production procedure. Goldschmidt uses chlorinated polysiloxane to react with hydroxylated acrylic or trimethylolpropane acrylate or pentaerythritol triacrylate and undergo condensation reaction and obtain acryloyl oxygen alkyl modified polysiloxane. Tertiary amine is used to neutralize the byproduct, hydrochloric acid. Apart from precipitation which needs to be removed by filtration, the obtained products contain a large amount of Si—O—C bonds, which are unstable and easy to be hydrolyzed. U.S. Pat. No. 4,978,726, U.S. Pat. No. 6,548,568, CN101089031 disclosed a preparation method, in which hydrogen containing polysiloxane is reacted with unsaturated monomer (such as allyl glycidyl ether) and undergo hydrogen silicide addition, and (methyl) acrylic acid is used to open the epoxy ring to obtain acryloyl oxygen alkyl modified polysiloxane. The energy consumption of the esterification reaction in the last step is very high, and the double bond in (methyl) acrylic acid can self-polymerize in the last esterification and dehydration step. U.S. Pat. No. 5,977,282 disclosed a method, in which hydrogen containing siloxane is reacted with allyl polyether mono alcohol and undergo addition reaction and then react with crylic acid and undergo dehydration and condensation reaction to produce acryloyl oxygen alkyl modified polysiloxane. It still cannot be avoided the addition reaction between allyl polyether and the Si—H bonds of the hydrogen containing siloxane.

There are some other documents in which hydroxyl containing polysiloxane is reacted with (methyl) crylic acid and directly dehydrate to produce acryloyl oxygen alkyl modified polysiloxane. However, there still exists the danger of self-polymerization of the double bond of (methyl) crylic acid.

SUMMARY OF THE INVENTION

Based on the above mentioned problem, the present invention is related to a method to prepare acryloyl group containing acryloyl oxygen alkyl modified polysiloxane through hydrosilylation and convenient controllable synthesis process, which not only overcomes the disadvantages in the foregoing methods, but also has low energy consumption and is highly controllable.

The other characteristic of the current invention is that a widely compatible acryloyl group containing acryloyl oxygen alkyl modified polysiloxane is obtained by introducing polyether segments with different HLB values, which can satisfy different flow control requirements in different radiation curing systems of unsaturated polyesters, epoxy acrylic, polyurethane acrylic, polyester acrylic, polyether acrylic, acrylate, etc.

The goal of the current invention is to provide an acryloyl group containing acryloyl oxygen alkyl modified polysiloxane and a method for its preparation, which solves the above mentioned problems in the state of the art.

The current invention is related to a surface control additive for a radiation curing system, wherein the surface control additive has the following constitutional formula:

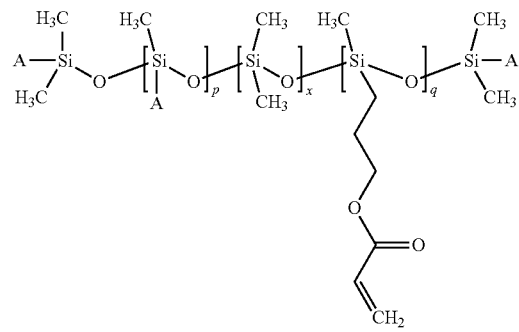

wherein A is

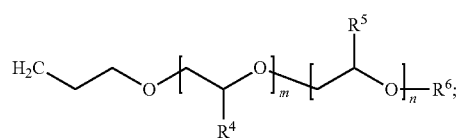

wherein m is an integer from 0 to 400, n is an integer from 1 to 500, x is an integer from 0 to 800, p is an integer from 0 to 600, q is an integer from 1 to 800, $R^4$ and $R^5$ are H or $CH_3$ respectively, $R^6$ is H or a linear or a branched alkyl group containing 1-18 carbon atoms or an acyl group containing 2-5 carbon atoms.

It is preferred that $R^6$ is methyl, ethyl, n-butyl, isobutyl or acetyl group.

The current invention also relates to a method to prepare the surface control additive according to claim 1 or 2, wherein the method contains the following steps:

First, component A and component B are added to the reactor, and 2% hexachloroplatinic acid solution is added as a catalyst and constitutes a final concentration of 0.02-0.2 wt % in relation to the whole mixture, and the reaction is carried out under 100-120° C. for 4-8 hours, and hydrogen addition silicide reaction occurs, wherein component B reacts with 1-90% of the silicon hydrogen groups in component A, the temperature in the reaction system is decreased to 60 to 80° C., component C and D are added and the reaction is carried out further for 2-6 hours until the characteristic IR peak of the silicon hydrogen disappears, wherein component C constitutes a concentration of 0.01-1 wt % in relation to the whole mixture, component D reacts with 1-90% of the silicon hydrogen groups in component A, and the volatile components are removed under vacuum at 70-100° C. and the said surface control additive is obtained, wherein said A component is hydrogen containing polysiloxane with the following formula:

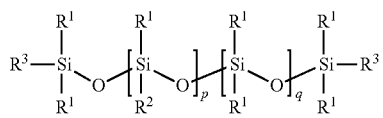

wherein $R^1$ is phenyl or lower alkyl with 1-4 carbon atoms, and all the $R^1$ can be the same or can be different, $R^2$ and $R^3$ are phenyl or lower alkyl with 1-4 carbons or H and at least one $R^2$ is H, p is an integer from 0 to 600, q is an integer from 1 to 800;

and wherein said B component is allyl polyether with the following formula:

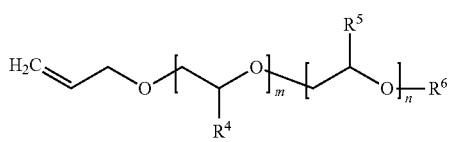

wherein $R^4$, $R^5$ are H or $CH_3$, $R^6$ is H or a linear or branched alkyl group containing 1-18 carbon atoms or an acyl group containing 2-5 carbon atoms, m and n are integers and the number average molecular weight of component B is 200 to 20000;

said C component is quinone, a phenol or arylamine polymerization inhibitor, and the amount of C component is 0.01-1 wt % in relation to the whole mixture;

said D component is allyl acrylate or allyl methacrylate.

It is preferred that said component A has a number average molecular weight of 500-20000, said $R^6$ is methyl, ethyl, butyl, isobutyl or acetyl group, and component B has a number average molecular weight of 300-10000.

It is preferred that said component A has a number average molecular weight of 1000-3000, and said component B has a number average molecular weight of 400-3000.

It is preferred that said component B has a HLB value of 1-17.

It is preferred that said component C is p-methoxyphenol, hydroquinone, phenothiazine, p-tert-butylcatechol, 1-hyroxy-4-methoxy benzene or 2,6-2,6-di-tert-butyl-4-methylphenol.

It is preferred that said surface control additive is applied to radiation curing (UV/EB) dopes and inks.

In addition, the allyl polyether B component can be divided into the following four kinds:

(1) all EO or PO type: $R^4$, $R^5$ are both H or both $CH_3$;

(2) the embedded type: allyl structure first connected with an alkene unit (ethylene oxide or propylene oxide) and then connected with another alkene unit;

(3) miscellaneous embedded type: allyl structure first connected a alkene unit with two mixed alkenes and then connected with a single alkene unit (or with an inverted sequence);

(4) complete miscellaneous embedded type: allyl structure connected first with mixed alkene unit with a certain ratio of two alkenes, then connected with a mixed unit with a different ratio or with the same ratio but different alkenes, or it can be that the two both have different mixed units.

The current invention is mainly used in radiation curing (UV/EB) paint and inks, and controls the surface flow of the coating. Since the surface control additive contains curable (methyl) acryloyl group, under UV/EB light, it can take part in film formation reaction and therefore the coating can maintain non adhesive and smooth for a long time. In the meantime, in comparison with the traditional surface control additive without reactive groups, it can reduce precipitation after curing to the lowest level. In addition, according to different modifying characteristics of different allyl polyether, by using different combinations of EO and PO, the surface control additive of the present invention can adapt to a free selection from high-polarity aquosity to a low-polarity aliphatic hydrocarbon solvent system and can thus satisfy the current requirements of different radiation curing system on the market to a large extent.

DESCRIPTION OF THE DRAWINGS

FIG. 1 is the IR spectrum of product in example 1.

DESCRIPTION OF THE PREFERRED EMBODIMENT

The current invention is further illustrated by the following examples, which do not limit the protection scope of the current invention.

First the preparation method of component A is as follows:

Hydrogen containing polysiloxane A1 (Mw=2052, SiH content is 0.39%):

Under the protection of nitrogen, 7.92 weight portions of hexamethyldisiloxane, 26.0 weight portions of hydrogen containing silicone oil 202 (SiH content is 1.5%, domestic) and 66.08 weight portions of octamethylcyclotetrasiloxane are added, the temperature is increased to 50-60° C., 0.88 weight portions of 10% trifluoromethane sulfonic acid butyl acetate solution is added, the temperature is maintained for 8 hours, and 0.1 weight portion of triethylamine is added, after 1 hour of neutralization, the mixture is let sit for 12 hours, filtered and self-made polysiloxane A1 is obtained. The average structure of the products is as follows:

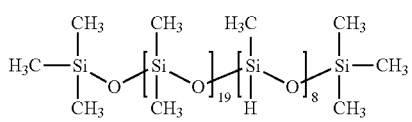

Hydrogen containing polysiloxane A2 (Mw=1680, SiH content is 0.48%):

Under the protection of nitrogen, 8.0 weight portions of hexamethyldisiloxane, 24.0 weight portions of hydrogen containing silicone oil 202 (SiH content is 1.5%, domestic) and 68.0 weight portions of octamethylcyclotetrasiloxane are added, the temperature is increased to 50-60° C., 0.88 weight portions of 10% trifluoromethane sulfonic acid butyl acetate solution is added, the temperature is maintained for 8 hours, and 0.1 weight portion of triethylamine is added, after 1 hour of neutralization, the mixture is let sit for 12 hours, filtered and self-made polysiloxane A2 is obtained. The average structure of the products is as follows:

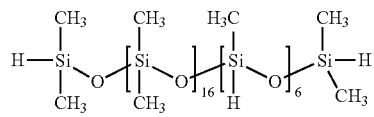

Hydrogen containing polysiloxane A3 (Mw=2000, SiH content is 0.3%):

Under the protection of nitrogen, 8.12 weight portions of hexamethyldisiloxane, 20.0 weight portions of hydrogen containing silicone oil 202 (SiH content is 1.5%, domestic) and 71.88 weight portions of octamethylcyclotetrasiloxane are added, the temperature is increased to 50-60° C., 0.88 weight portions of 10% trifluoromethane sulfonic acid butyl acetate solution is added, the temperature is maintained for 8 hours, and 0.1 weight portion of triethylamine is added, after 1 hour of neutralization, the mixture is let sit for 12 hours, filtered and self-made polysiloxane A3 is obtained. The average structure of the products is as follows:

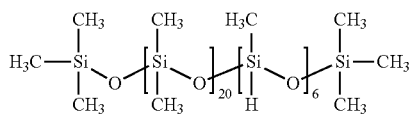

Example 1 (Solvent Type for UV)

In the four-mouth bottle, 41.37 weight portions of hydrogen containing polysiloxane A1 and 0.06 weight portions of 2% hexachloroplatinic acid solution are added. The temperature is increased to 100° C. After 2 hours of stirring, 48.46 weight portions of allyl polyether (Mw=600, PO:EO=3:1, the end is OCH$_3$), the temperature is kept at 100-120° C. for 6 hours until the characteristic peak of SiH does not have any significant change, and the temperature is then decreased to 60-80° C. 0.04 weight portion of hydroquinone is added, and the mixture is stirred for 15 minutes. A pre-mixture of 15 weight portion of allyl methacrylate and 0.06 portion of hydroquinone is dropwise added within 3 hours. The temperature is maintained until the characteristic IR peak of SiH disappears. The mixture is vacuumized at 80° C. until the weight portion of solids is more than 98% (120° C.), and yellow low viscosity liquid is obtained, which is the target product of the current invention. FIG. 1 is the IR spectrum of the product. The average formula is as follows:

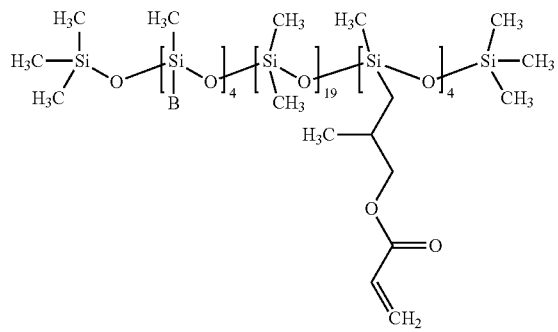

wherein B is the residues of the silicide hydrogen addition reaction of allyl polyether.

Example 2 (Solvent Type for UV)

In the four-mouth bottle, 37.56 weight portions of hydrogen containing polysiloxane A1 and 0.06 weight portions of 2% hexachloroplatinic acid solution are added. The temperature is increased to 100° C. After 2 hours of stirring, 51.13 weight portions of allyl polyether (Mw=570, PO:EO=1:3, the end is O(CH$_2$)$_3$CH$_3$), the temperature is kept at 100-120° C. for 6 hours until the characteristic peak of SiH does not have any significant change, and the temperature is then decreased to 60-80° C. 0.04 weight portion of hydroquinone is added, and the mixture is stirred for 15 minutes. A pre-mixture of 15 weight portion of allyl methacrylate and 0.06 portion of hydroquinone is dropwise added within 3 hours. The temperature is maintained until the characteristic IR peak of SiH disappears. The mixture is vacuumized at 80° C. until the weight portion of solids is more than 98% (120° C.), and yellow low viscosity liquid is obtained, which is the target product of the current invention. FIG. 1 is the IR spectrum of the product. The average formula is as follows:

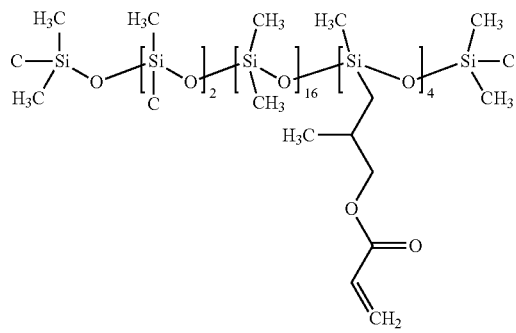

wherein C is the residues of the silicide hydrogen addition reaction of allyl polyether.

Example 3 (Aqueous for UV)

In the four-mouth bottle, 39.24 weight portions of hydrogen containing polysiloxane A3 and 0.06 weight portions of 2% hexachloroplatinic acid solution are added. The temperature is increased to 100° C. After 2 hours of stirring, 52.29 weight portions of allyl polyether (Mw=800, EO, the end is $OCH_3$), the temperature is kept at 100-120° C. for 6 hours until the characteristic peak of SiH does not have any significant change, and the temperature is then decreased to 60-80° C. 0.04 weight portion of hydroquinone is added, and the mixture is stirred for 1.5 minutes. A pre-mixture of 10 weight portion of allyl methacrylate and 0.06 portion of hydroquinone is dropwise added within 3 hours. The temperature is maintained until the characteristic IR peak of SiH disappears. The mixture is vacuumized at 80° C. until the weight portion of solids is more than 96% (120° C.), and yellow low viscosity liquid is obtained, which is the target product of the current invention. FIG. 1 is the IR spectrum of the product. The average formula is as follows:

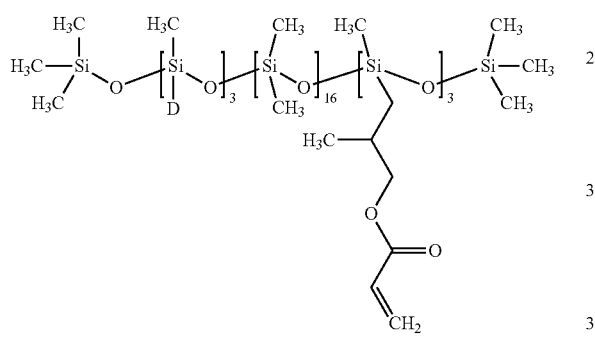

wherein D is the residues of the silicide hydrogen addition reaction of allyl polyether.

The data of application of the products of the examples of the current invention:

In order to evaluate the characteristics of the surface control additive of the current invention, certain amount of the surface control additive is added into the UV paint, and the paint is then sprayed onto tinplate or onto plastic base material. These are then placed into a UV solidifier to be solidify, and the levelling, smoothness and the durability of the coating smoothness are tested.

As a control, two normal organosilicon leveling agents which do not contain acryloyl group, AFCONA 3231 and AFCONA 3522 (for aqueous system), and a surface control additive L on the market (a polysiloxane containing unsaturated functional groups) are used. The UV curing machine is Xlite 7250 P from OPAS UV Curing Corporation, Taiwan.

The three testing recipes of table 1 are used to evaluate the surface control additives of the current invention.

TABLE 1

| Recipes for the Test | Raw Material | Mass fraction | Chemical structures | Source |
|---|---|---|---|---|
| Recipe I (solvent type UV) | Desmolux VP LS 2265 | 50 portions | Aliphatic urethane acrylates | BAYER |
| | TPGDA | 35 portions | Tripropylene glycol diacrylante | domestic |
| | PEG(400)DA | 10 portions | polyethylene glycol (400) acrylate | domestic |
| | Darocur 1173 | 4 portions | α-hydroxy ketone | Ciba |
| | Surface control additive | 1 portion | | |
| Recipe II (Solvent type UV) | Laromer LR 8765 | 60 portions | aliphatic epoxy acrylates | BASF |
| | TPGDA | 20 portions | Tripropylene glycol diacrylante | domestic |
| | TMPTA | 15 portions | Trimethylolpropane triacrylate | domestic |
| | Darocur 1173 | 3 portions | α-hydroxyl ketone | Ciba |
| | Surface control additive | 1 portion | | |
| Recipe III (aquesous UV) | Bayhydrol UV 2282 | 76.3 portions | water-based polyurethane acrylates | BAYER |
| | Tert-butyl alcohol | 15.9 portions | | domestic |
| | Tinuvin 292 | 2.5 portions | sebacic acid esters, light stabilizer | Ciba |
| | Darocur 1173 | 3.5 portions | α-hydroxyl ketone | Ciba |
| | Surface control additive | 1.8 portions | | |

Test of Solvent type UV: add different kinds of surface control additives to the above pre-prepared UV paint (recipe I and II). The mixture is placed into a shaker and is shaked for 5 minutes. The foam inhibition and antifoam effects are observed. After the foam disappears completely, the paint is sprayed onto a tinplate, and the tinplate is then placed into a solidifier to be solidified completely. The coating is 30 μm thick. The levelling, cavity shrinkage cavity situation, smoothness and the smoothness after 100 times cleaning with acetic ether are tested.

Test of aqueous UV: add different kinds of surface control additives to the above pre-prepared UV paint (recipe III). The mixture is placed into a shaker and is shaked for 5 minutes. The foam inhibition and antifoam effects are observed. After the foam disappears completely, the paint is sprayed onto plastics base material, and the material is then placed into an oven and is baked at 60° C. for some time in order to remove water and other volatile components. It is then placed into a solidifier to be solidified completely. The coating is 30 μm thick. The levelling, cavity shrinkage cavity situation, smoothness and the smoothness after 100 times cleaning with acetic ether are tested.

The test results are shown in Table 2:

TABLE 2

Application test groups and Test results

| Project | Paint Recipe | Surface Control Additives | Foam Inhibition in the Bottle | Antifoam Effects in the Bottle | Leveling property | Cavity Shrinkage | Smoothness | Smoothness (after cleaning) |
|---|---|---|---|---|---|---|---|---|
| 1 | Test Recipe I | Product in example 1 | 2 | 2 | 1 | none | 1 | 1- |
| 2 | Test Recipe I | Product in Example 2 | 3 | 3 | 1 | none | 1 | 1- |
| 3 | Test Recipe I | Product L on the market | 2 | 1 | 1 | With cavity shrinkage | 1 | 1- |
| 4 | Test Recipe I | AFCONA3231 | 3 | 2 | 1 | none | 1 | 4 |
| 5 | Test Recipe II | Product in example 1 | 3 | 2 | 1 | none | 1 | 1- |
| 6 | Test Recipe II | Product in Example 2 | 4 | 3 | 1 | none | 1 | 1- |
| 7 | Test Recipe II | Product L on the market | 2 | 1 | 1 | With cavity shrinkage | 1 | 1- |
| 8 | Test Recipe II | AFCONA3231 | 3 | 3 | 1 | none | 1 | 4 |
| 9 | Test Recipe III | Product in example 3 | 3 | 3 | 1 | none | 1 | 1- |
| 10 | Test Recipe III | AFCONA3522 | 3 | 2 | 1 | none | 1 | 4 |

\* foam inhibition test: eyeballing, 1 means no foam, 2 means with few foam, 3 means with moderate amount of foam, 4 means with a considerable amount of foam, 5 means foam is all over.
Anti-foam test: eyeballing, 1 means anti-foam effect is extremely fast, 2 means anti-foam effect is fast, 3 means anti-foam effect is OK, 4 means anti-foam effect is relatively slow, 5 means anti-foam effect is slow;
Levelling test: eyeballing, 1 means coating is continuous and smooth, 2 means coating is relatively continuous but with careful observation it is a little uneven, 3 means coating is not very smooth and is with stripes, 4 means coating has orange skin, orange stripes, 5 means coating has cavity shrinkage.
Smoothness test: hand feel, 1 means very smooth, without impedance, 2 means with certain impedance, 3 means smooth but hand feel is poor, 4 means coating is not smooth, with poor hand feel, 5 means hand feel with great impedance, not smooth.

From projects 1-4 and 5-6, it can be derived that, although the smoothness of product L does not change after cleaning, which is the same as the test results of the products of example 1 and 2, however, since the product L does not contain polyether modified chain segments, it does not possess good compatibility of the system, and the coating has obvious cavity shrinkage phenomenon. Since AFCONA3231 contains polyether modified chain segments, no shrinkage phenomenon occurs. However, since AFCONA3231 lacks reactive functional groups which can be solidified, the smoothness is lost significantly during cleaning with acetic ether. The products of example 1 and 2 have adjustable and compatible polyether segments, and also contain acryloyl group which can be solidified with paint coating, they can keep the coating levelling, and cavity shrinkage resistant, as well as a good smoothness for a long time. The test results of 9-10 further demonstrate that the surface control additives of the current invention have great system compatibility and can maintain the characteristics of the UV paint coating for a long time.

What is claimed is:
1. A surface control additive for a radiation curing system, characterized in that the surface control additive has the following formula:

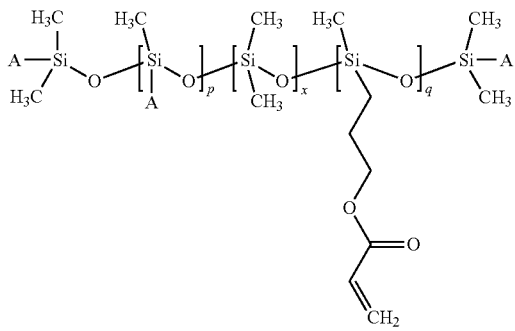

wherein A is

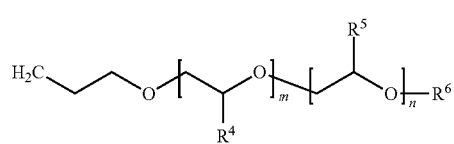

wherein m is an integer from 0 to 400, n is an integer from 1 to 500, x is an integer from 0 to 800, p is an integer from 0 to 600, q is an integer from 1 to 800, $R^4$ and $R^5$ are independently H or $CH_3$, $R^6$ is H or a linear or a branched alkyl group containing 1-18 carbon atoms or an acyl group containing 2-5 carbon atoms.

2. The surface control additive according to claim 1, wherein $R^6$ is methyl, ethyl, n-butyl, isobutyl or acetyl group.

3. A method to prepare a surface control additive according to claim 1, wherein the method contains the following steps:
first, component A and component B are added to the reactor, and 2% hexachloroplatinic acid solution is added as a catalyst and constitutes a final concentration of 0.02-0.2 wt % of the whole mixture, and the reaction is carried out under 100-120° C. for 4-8 hours, and hydrogen addition silicide reaction occurs, wherein component B reacts with 1-90% of the silicon hydrogen groups in component A, the temperature in the reaction system is decreased to 60 to 80° C., component C and D are added and the reaction is carried out further for 2-6 hours until the characteristic IR peak of the silicon hydrogen disappears, wherein component C constitutes a concentration of 0.01-1 wt % of the whole mixture, component D reacts with 1-90% of the silicon hydrogen groups in component A, and volatile components are removed under vacuum at 70-100° C. and the surface control additive is obtained,
wherein said component A is hydrogen containing polysiloxane with the following formula:

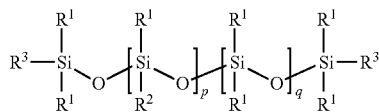

wherein $R^1$ is $CH_3$, $R^2$ is $CH_3$ or H and at least one $R^2$ is H, and $R^3$ is H, p is an integer from 1 to 600, q is an integer from 1 to 800;
wherein said component B is an allyl polyether with the following formula:

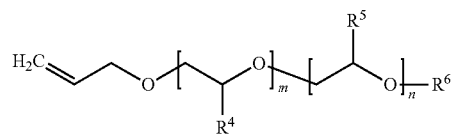

wherein $R^4$ and $R^5$ are independently H or $CH_3$, $R^6$ is H or a linear or branched alkyl group containing 1-18 carbon atoms or an acyl group containing 2-5 carbon atoms, m is an integer from 0 to 400, n is an integer from 1 to 500, and the number average molecular weight of component B is 200 to 20000;
wherein said component C is quinone, a phenol or arylamine polymerization inhibitor, and the amount of component C is 0.01-1 wt % of the whole mixture; and
wherein said component D is allyl acrylate or allyl methacrylate.

4. The method according to claim 3, wherein said component A has a number average molecular weight of 500-20000, said $R^6$ is methyl, ethyl, butyl, isobutyl or acetyl group, and component B has a number average molecular weight of 300-10000.

5. The method according to claim 4, wherein said component A has a number average molecular weight of 1000-3000, and said component B has a number average molecular weight of 400-3000.

6. The method according to claim 3, wherein said component B has an HLB value of 1-17.

7. The method according to claim 6, wherein said component C is p-methoxyphenol, hydroquinone, phenothiazine, p-tert-butylcatechol, 1-hyroxy-4-methoxy benzene or 2,6-2,6-di-tert-butyl-4-methylphenol.

8. The surface control additive according to claim 1, wherein said surface control additive is applied to radiation curing (UV/EB) dopes and inks.

9. The surface control additive according to claim 2, wherein said surface control additive is applied to radiation curing (MEE) dopes and inks.

10. The method according to claim 3, wherein $R^6$ is methyl, ethyl, n-butyl, isobutyl or acetyl group.

11. The method accordingly to claim 3, wherein $R^2$ is H.

* * * * *